United States Patent
Ellis et al.

(10) Patent No.: US 7,085,152 B2
(45) Date of Patent: Aug. 1, 2006

(54) MEMORY SYSTEM SEGMENTED POWER SUPPLY AND CONTROL

(75) Inventors: Robert M. Ellis, Hillsboro, OR (US); Stephen R. Mooney, Beaverton, OR (US); Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/748,460

(22) Filed: Dec. 29, 2003

(65) Prior Publication Data

US 2005/0146919 A1    Jul. 7, 2005

(51) Int. Cl.
*G11C 11/24* (2006.01)

(52) U.S. Cl. .................. 365/149; 365/226; 365/222

(58) Field of Classification Search ........... 365/149, 365/226, 222
See application file for complete search history.

(56) References Cited

U.S. PATENT DOCUMENTS

| 6,603,685 B1 * | 8/2003 | Hidaka et al. ............... 365/226 |
| 6,731,531 B1 * | 5/2004 | Forbes et al. ............... 365/149 |

FOREIGN PATENT DOCUMENTS

EP    1074993 A    2/2001

OTHER PUBLICATIONS

PCT Search Report, PCT/US02/043496, mailed May 12, 2005.

* cited by examiner

*Primary Examiner*—Huan Hoang
(74) *Attorney, Agent, or Firm*—Blakely, Sokoloff, Taylor & Zafman LLP

(57) ABSTRACT

A memory device having memory cells supplied with a separate higher voltage power than the separate power supplied to memory logic, and a lower power state that entails removing power from at least some of the logic such that refresh operations to preserve the contents of the memory cells continue to take place, but at least some of the interface to the memory device is powered down to reduce power consumption.

29 Claims, 9 Drawing Sheets

MEMORY SYSTEM SEGMENTED POWER SUPPLY AND CONTROL

BACKGROUND

Computer systems continue to be designed to meet the two often opposing goals of increased performance and decreased power consumption (sometimes manifesting in trying to maintain a level of power consumption while increasing performance). The struggle to meet both goals becomes quite evident in the case of electronic devices such as portable computer systems (including notebook and hand-held computers), networking appliances (including firewall appliances and intelligent routers), and banks of servers (including blade and telco servers), all of which employ memory systems having considerable quantities of DRAM (dynamic random access memory). As ever more uses for such electronic devices are found, there is a need for faster processors, greater quantities of memory, etc. However, as ever more uses for such devices are found, there is a need to consume lesser amounts of power to increase battery life in portable application and to allow for greater densities of electronic devices to be assembled together in centralized facilities.

This struggle has resulted in efforts to find ways to decrease the amount of power required by each of the components of such electronic devices, including memory devices. Known approaches include creating reduced power modes (commonly referred to as "sleep modes" or "hibernation modes") for such electronic devices to enter into when not actively being used. Specifically, DRAM devices have been created with lower power modes, including what is commonly referred to in the DRAM device industry as "self refresh" mode where interactions between DRAM devices and other components are minimized. Self refresh modes entail using a minimal amount of logic built into a DRAM device to allow the DRAM device to autonomously carry out maintenance functions such as refreshing the DRAM device's memory cells.

However, such approaches to reducing DRAM device power consumption have not addressed the problem of power wasted as a result of the growing disparity in the voltage level at which the memory cells within DRAM devices must operate to acquire and preserve a charge indicating bit values within memory cells, and the ever lower voltage levels required by processors and other logic that are often coupled to DRAM devices. As a result of this disparity, inefficient I/O interface and memory controller logic designs must be employed, and opportunities to decrease power consumption and/or to increase the speeds at which memory is accessed by making use of lower voltage interfaces are lost.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention as hereinafter claimed.

Embodiments of the present invention concern segmenting the power supply used for memory devices such that different power supplies are used to supply power at differing voltage levels for DRAM memory cells and at least a portion of DRAM interface logic, thereby reducing the overall amount of power required by DRAM devices. Although the following discussion centers on DRAM devices, it will be understood by those skilled in the art that the present invention as hereinafter claimed may be practiced in support of other memory devices. Also, although at least part of the following discussion centers on memory within computer systems, it will be understood by those skilled in the art that the present invention as hereinafter claimed may be practiced in connection with other electronic devices or systems having memory devices. It will also be understood by those skilled in the art that although the following discussion centers on memory devices in which memory cells are organized in two dimensional arrays of rows and columns, the memory cells may be organized in any of a number of ways, including into banks and with or without interleaving, arrays of more than two dimensions, content-addressable, etc.

Figure 1:
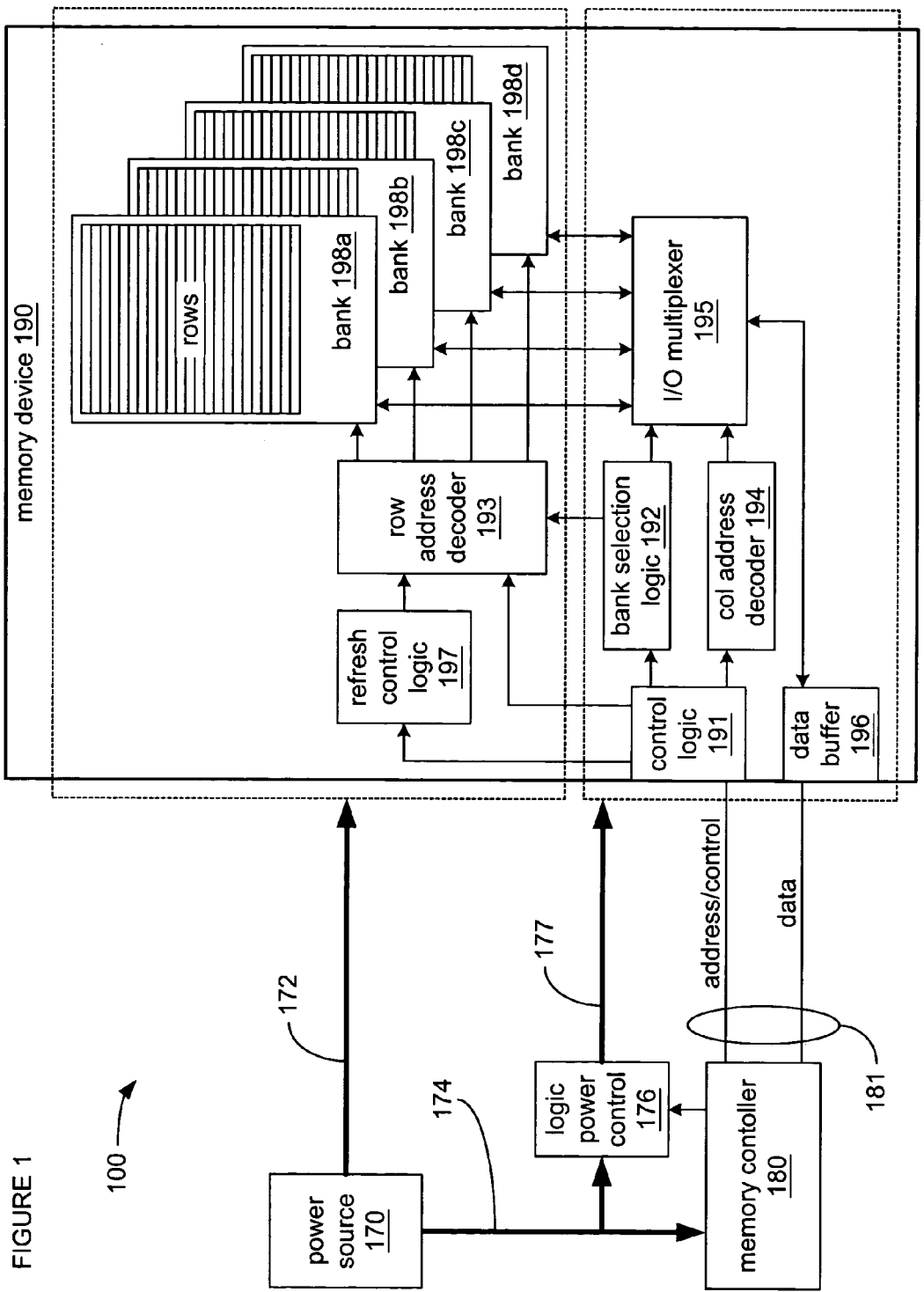
FIG. 1 is a block diagram of an embodiment employing a memory system.

FIG. 1 is a block diagram of one embodiment employing a memory system. Memory system 100 is made up, at least in part, of memory controller 180 and memory device 190 coupled together via memory bus 181. Those skilled in the art of the design of memory systems will readily recognize that FIG. 1 depicts one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 100 is depicted as having only one memory bus 181 and only one memory device 190 for the sake of simplicity in the discussion that follows, it will be readily understood by those skilled in the art that other possible embodiments of memory system 100 may be made up of multiple memory buses and/or devices without departing from the spirit and scope of the claimed invention.

Memory controller 180 controls the functions carried out by memory device 190 as part of providing access to memory device 190 to external devices (not shown) coupled to memory controller 180, such as a processor, bus mastering I/O controller, etc. Specifically, an external device coupled to memory controller 180 issues commands to memory controller 180 either to store data within memory device 190, or to retrieve stored data from memory device

190. Memory controller 180 receives these commands and relays them to memory device 190 in a format having timing and protocols compatible with memory bus 181 and/or the combination of control logic 191 and data buffer 196 that make up the interface between memory device 190 and memory bus 181. In effect, memory controller 180 coordinates accesses made to memory cells within memory device 190 in answer to read and write commands from external devices. In support of these functions in various embodiments, memory controller 180 also coordinates various maintenance operations that must be performed to ensure that data stored within memory device 190 is preserved, including the initiation of regular refresh operations and the occurrence of precharge operations as needed between accesses.

Memory bus 181 is made up of various control, address and data signal lines coupling together memory controller 180 and memory device 190. The exact quantity and characteristics of the various signal lines making up various possible embodiments of memory bus 181 may be configured to be interoperable with any of a number of possible memory interfaces, including those meant to be compatible with known types of memory devices, among them being DRAM (dynamic random access memory) devices such as FPM (fast page mode) memory devices, EDO (extended data out), dual-port VRAM (video random access memory), window RAM, SDR (single data rate), DDR (double data rate), RAMBUS™ DRAM, etc. In some embodiments, where activity on various signal lines is meant to be coordinated with a clock signal, one or more of the signal lines, perhaps the control signal lines, serves to transmit a clock signal between memory controller 180 and memory device 190. In some embodiments, one or more control signals and address signals may be multiplexed onto common signal lines such that control signals and address signals are transmitted at different times on common conductors for carrying signals between memory controller 180 and memory device 190. Also, in some embodiments, one or more address signals and data signals may be multiplexed onto common signal lines.

Memory device 190 is a DRAM memory device with an interface made up of control logic 191 and data buffer 196 configured to be interoperable with memory bus 181. In some embodiments, memory device 190 is a single integrated circuit. In other embodiments, memory device 190 is made up of multiple integrated circuits of a removable memory module, such as a SIMM (single inline memory module), SIPP (single inline pin package), DIMM (dual inline memory module), etc.

The memory cells of memory device 190 are grouped into multiple banks, such as banks 198a–d, with each bank being organized into a two dimensional array of memory cells having rows and columns. However, those skilled in the art will readily recognize that the memory cells within memory device may be organized in any of a number of possible ways. In some embodiments, control logic 191 receives at least some commands and addresses from memory controller 180 through memory bus 181, and uses bank selection logic 192 and row address decoder 193 to gain access to the appropriate rows, while using column address decoder 194, I/O multiplexer 195 and/or data buffer 196 to carry out the appropriate actions, at least for read and write commands. Control logic 191 further coordinates the carrying out of commands received from memory controller 180 with the refreshing of memory cells within banks 198a-d by refresh control logic 197.

In various embodiments as depicted in FIG. 1, memory controller 180 and memory device 190 receive power from power source 170. Memory controller 180 is supplied with logic level power through logic level power line 174. In some embodiments, this same logic level power received by memory controller 180 is selectively supplied to a portion of memory device 190 through logic power control 176 under the control of memory controller 180. In alternate embodiments, this same logic level power received by memory controller 180 is supplied to a portion of memory device 190 directly from logic level power line 174 without intervening logic power control 176. This portion of memory device 190 supplied with logic level power (outlined with a dotted rectangle) is made up, at least in part, of control logic 191, bank selection logic 192, column address decoder 194, I/O multiplexer 195 and data buffer 196. However, another portion of memory device 190 receives storage level power through storage level power line 172 (also outlined with a dotted rectangle). This portion of memory device 190 supplied with storage level power is made up, at least in part, of refresh control logic 197, row address decoder 193 and banks 198a–d.

As those skilled in the art will recognize, the exact choice of which of control logic 191, bank selection logic 192, row address decoder 193, column address decoder 194, I/O multiplexer 195, data buffer 196 and refresh control logic 197 are supplied with one or the other of logic level power via logic level power line 177 or storage level power via storage level power line 172 may depart in various embodiments from what is depicted in FIG. 1 without departing from the spirit and scope of the claimed invention. Like memory controller 180, control logic 191, bank selection logic 192, row address decoder 193, column address decoder 194, I/O multiplexer 195, data buffer 196, and refresh control logic 197 are logic circuit devices, and as logic circuit devices, are able to be designed to make use of recent improvements in transistors and other technologies that have become available for logic circuit design, including the use of ever smaller transistors. Such smaller transistors in logic circuits do not require as high a voltage level to distinguish between 0 and 1 bit values as do larger transistors, and so such smaller transistors can be operated more efficiently at lower voltage levels. This makes the use of higher voltage levels as would be required by larger transistors with smaller transistors unnecessary, and in many logic circuits employing such smaller transistors, the use of such a higher voltage provides excess electrical energy that cannot be used by such smaller transistors and which, therefore, much be wastefully converted to and dissipated as heat. However, in contrast to such logic circuits, the memory cells of a DRAM device still require a higher voltage level to reliably distinguish between 0 and 1 bit values as a result of the use of charges that are dynamically stored and maintained in the capacitor-like design of those memory cells where a stored charge always decays over time and has to be repeatedly refreshed (recharged) to be maintained. The fact of this decay over time requires a higher voltage level to be used in storing the charge to provide some "extra" separation in voltage levels signifying 0 and 1 bit values so that voltage levels between partly decayed 0 and 1 bit values are still distinguishable after that partial decay has occurred. For these and related reasons, DRAM memory cells require a somewhat higher voltage level from a power source despite the fact that the size of the transistors used in the memory cells has been decreasing just as the transistors of logic circuits have.

The provision of two different portions of memory device 190 with two different power sources affords an opportunity to save power in situations when the electronic system of which memory system 100 is placed in a lower power state such that accesses to store data within memory device 190 or retrieve data from memory device 190 are suspended. In such a lower power state, it may be desirable to provide memory device 190 with power only to the degree necessary to preserve data stored within banks 198a–d, and this may be accomplished in some embodiments by allowing the logic level power provided via logic level power line 177 to be selectively turned off via logic power control 176. In such embodiments, row address decoder 193 and refresh control logic 197 may use the storage level power supplied via storage level power line 172 such that refresh control logic 197 is able to continue to initiate refresh cycles on rows within banks 198a–d possibly selected at intervals via a counter within refresh control logic 197, and row address decoder 193 is able to continue selecting the rows specified by refresh control logic 197 to be put through a refresh operation.

Depending on specific details of implementation of banks 198a–d, the provision of storage level power to at least row address decoder 193 may be necessary for row address decoder 193 to properly drive word lines within banks 198a–d with sufficient voltage levels. Likewise, the provision of other components within memory device 190 that are directly coupled to banks 198a–d, such as I/O multiplexer 195, with storage level power may also be necessary, again to support signaling with sufficient voltage levels.

Supplying the same logic level power to control logic 191 and data buffer 196 as is supplied to memory controller 180 permits control logic 191 and data buffer 196 to operate at a more efficient voltage level that does not waste electrical energy. Sharing this same lower voltage also provides the opportunity to use a lower voltage level in signaling across memory bus 181 between memory controller 180 and memory device 190, and the resulting opportunity to make use of lower voltage swings to convey control, address, data and/or other signals affords the further opportunity to increase the rate at which such signals are transmitted across memory bus 181, which in turn, provides the further opportunity to increase the performance of memory bus 181. Furthermore, sharing this same lower voltage level may also alleviate the need to design the interface within memory controller 180 to couple memory controller 180 to memory bus 181 to accommodate higher voltage levels, thereby potentially simplifying the design of that interface within memory controller 180 and/or potentially allowing a faster interface to be more easily provided. Furthermore, the reduction in power consumed by having memory bus 181 and the interfaces to memory bus 181 within both memory controller 180 and memory device 190 (such as control logic 191 and/or data buffer 196) can become significant, especially where multiple ones of memory device 190 make up memory system 100.

Figure 2:
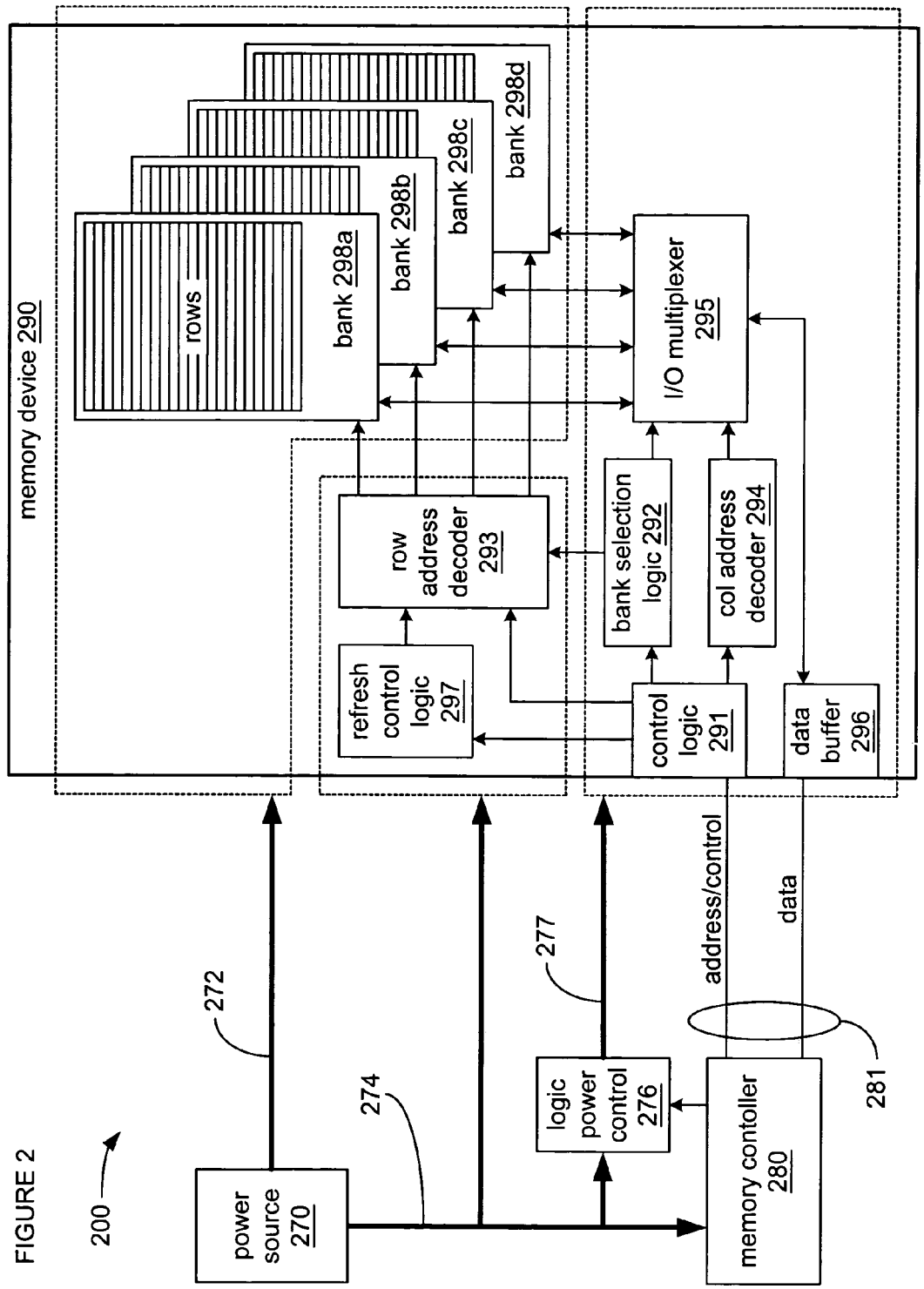
FIG. 2 is a block diagram of another embodiment employing a memory system.

FIG. 2 is a block diagram of another embodiment employing a memory system. Not unlike memory system 100 of FIG. 1, memory system 200 is made up, at least in part, of memory controller 280 and memory device 290 coupled together via memory bus 281. Those skilled in the art of the design of memory systems will readily recognize that FIG. 2 depicts one form of a relatively simple memory system, and that alternate embodiments are possible in which the exact arrangement and configuration of components may be reduced, augmented or otherwise altered without departing from the spirit and scope of the present invention as hereinafter claimed.

Memory controller 280 controls the functions carried out by memory device 290 as part of providing access to memory device 290 to external devices (not shown) coupled to memory controller 280, such as a processor, bus mastering I/O controller, etc. Memory controller 280 coordinates accesses made to memory cells within memory device 290 in answer to read and write commands from external devices. Memory controller 280 also coordinates various maintenance operations that must be performed to ensure that data stored within memory device 290 is preserved, including the initiation of regular refresh operations and the occurrence of precharge operations as needed between accesses. Memory bus 281 is made up of various control, address and data signal lines coupling together memory controller 280 and memory device 290. The exact quantity and characteristics of the various signal lines making up various possible embodiments of memory bus 281 may be configured to be interoperable with any of a number of possible memory interfaces. In some embodiments, activity on various signal lines of memory bus 281 may be meant to be coordinated with a clock signal. Memory device 290 is a DRAM memory device with an interface made up of control logic 291 and data buffer 296 configured to be interoperable with memory bus 281. In some embodiments, memory device 290 is a single integrated circuit, and in other embodiments, memory device 290 is made up of multiple integrated circuits of a removable memory module. The memory cells of memory device 290 are grouped into multiple banks, such as banks 298a–d, with each bank being organized into a two dimensional array of memory cells having rows and columns.

In various embodiments, memory controller 280 is supplied with logic level power through logic level power line 274. This same logic level power is selectively supplied to a portion of memory device 290 through logic power control 276 under the control of memory controller 280, namely a portion encompassing control logic 291, banks selection logic 292, column address decoder 294, I/O multiplexer 295 and data buffer 296. This same logic level power is also supplied to another portion of memory device 290 directly from logic level power line 274 without intervening logic power control 276, namely a portion encompassing row address decoder 293 and refresh control logic 297. Another portion of memory device 290 receives storage level power through storage level power line 272, namely a portion encompassing banks 298a–d. As those skilled in the art will recognize, the exact choice of which of control logic 291, bank selection logic 292, row address decoder 293, column address decoder 294, I/O multiplexer 295, data buffer 296 and refresh control logic 297 are supplied with one or the other of logic level power or storage level power, as well as the choice as to whether logic level power is selectively supplied through logic power control 276, or not, may depart in various embodiments from what is depicted in FIG. 2 without departing from the spirit and scope of the claimed invention.

The provision of three different portions of memory device 290 with two different power sources, with one of the three portions being supplied one of the two power sources in a selective manner, affords an opportunity to save power in situations when the electronic system of which memory system 200 is placed in a lower power state where, as was the case with memory system 200 of FIG. 1, it may be desirable to provide memory device 290 with power only to the degree necessary to preserve data stored within banks 298a–d. This may be accomplished in some embodiments by allowing the logic level power provided via logic level power line 277 to be selectively turned off to a portion of memory device 290 via logic power control 276, while the same logic level power continues to be provided to another portion of memory device 290 via logic power line 274. In such embodiments, banks 298a–d continue to be supplied with storage level power to preserve the contents of the memory cells within banks 298a–d. Furthermore, row address decoder 293 and refresh control logic 297 may use logic level power supplied via logic level power line 274 such that refresh control logic 297 is able to continue to initiate refresh cycles on rows within banks 298a–d possibly selected at intervals via a counter within refresh control logic 297, and row address decoder 293 is able to continue selecting the rows specified by refresh control logic 297 to be put through a refresh operation.

Depending on specific details of implementation of banks 298a–d, the provision of storage level power to at least row address decoder 293 may be necessary for row address decoder 293 to properly drive word lines within banks 298a–d with sufficient voltage levels. Likewise, the provision of other components within memory device 290 that are directly coupled to banks 298a–d, such as I/O multiplexer 295, with storage level power may also be necessary, again to support signaling with sufficient voltage levels.

In a manner not unlike memory system 100 of FIG. 1, supplying the same logic level power to control logic 291 and data buffer 296 as is supplied to memory controller 280 permits control logic 291 and data buffer 296 to operate at a more efficient voltage level that does not waste electrical energy. Sharing this same lower voltage also provides the opportunity to use a lower voltage level in signaling across memory bus 281 between memory controller 280 and memory device 290, and the resulting opportunity to make use of lower voltage swings to convey control, address, data and/or other signals affords the further opportunity to increase the rate at which such signals are transmitted across memory bus 281, which in turn, provides the further opportunity to increase the performance of memory bus 281.

Figure 3:
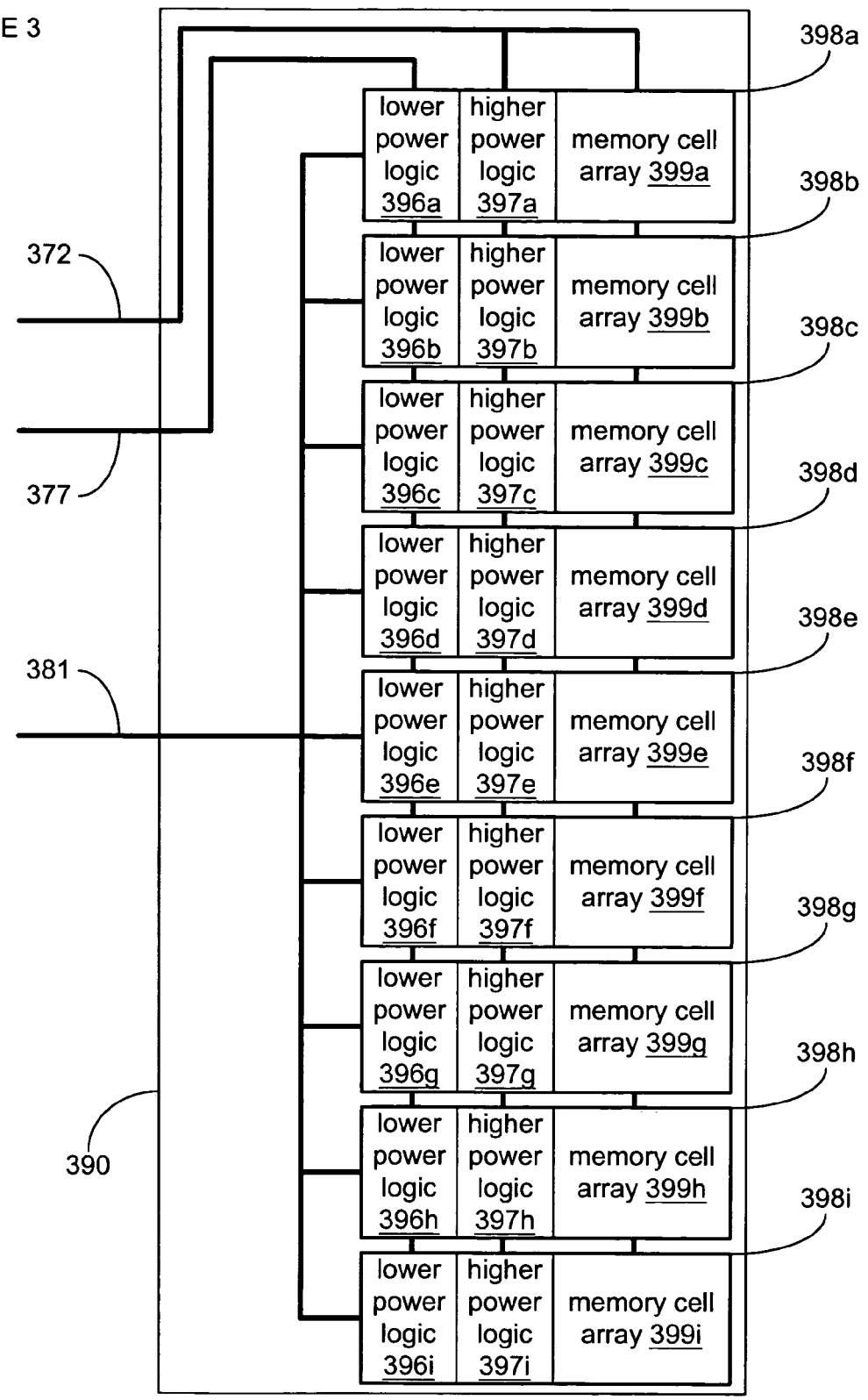
FIG. 3 is a block diagram of an embodiment employing a memory device.

FIG. 3 is a block diagram of one embodiment employing a memory device. In various possible embodiments, memory device 390 is made up, at least in part, of memory circuits 398a–i assembled together as ICs on a substrate (such as a circuitboard) or as dies within a multiple die package. More specifically, in some embodiments, memory device 390 is an unbuffered DIMM (dual inline memory module). Each of memory circuits 398a–i is made up, at least in part, of memory cell arrays 399a–i, higher power logic 397a–i and lower power logic 396a–i, respectively. Each of lower power logic 396a–i is coupled to memory bus 381, and together with corresponding ones of higher power logic 397a–i, couples corresponding ones of memory arrays 399a–i within memory device 390 to a memory controller and/or other devices (not shown) also coupled to memory bus 381 outside of memory device 390. Lower power logic 396a–i are all supplied with logic level power from logic level power line 377, and both higher power logic 397a–i and memory cells 399a–i are all supplied with storage level power from storage level power line 372.

Each of memory cell arrays 399a–i is made up of numerous memory cells organized into at least a single two-dimensional array. To ensure the reliable retention of the data stored in these memory cells, the storage level power supplied to each of memory cell arrays 399a–i is of sufficient voltage to allow reliable distinguishing between 0 and 1 bit values of charges stored in memory cells of a capacitor-like configuration, as discussed at length, earlier. Each one of lower power logic 396a–i, together with corresponding ones of higher power logic 397a–i, provides the interface logic that carries out commands received from memory bus 381 to either store data within or retrieve data from corresponding ones of memory cell arrays 399a–i, as well as carrying out other various functions. The splitting of this interface logic between lower power and higher power logic may, in some embodiments, allow the portions of this interface logic within each of higher power logic 397a–i that are more closely coupled to memory cell arrays 399a–i to use the storage level power supplied via storage level power line 372 to interact with corresponding ones of memory cell arrays 399a–i with signaling voltage levels that may be more easily compatible with memory cell arrays 399a–i. At the same time, this same splitting of interface logic may, in some embodiments, allow the portions of this interface logic within each of lower power logic 396a–i that are more closely coupled to memory bus 381 to use the logic level power supplied via logic level power line 377 to interact with memory bus 381 with signaling voltage levels that may be more easily compatible with other devices coupled to memory bus 381. In various implementations, the voltage level of the logic level power supplied via logic level power line 377 is lower than the voltage level of the storage level power supplied via storage level power line 372 in recognition of the possible advantages of using lower voltage signaling across memory bus 381, including lower overall power consumption and shorter signal rise and fall times leading to opportunities to increase the transfer rate of addresses, commands and/or data across memory bus 381.

Also, in some embodiments, the separation of this interface logic between lower power logic 396a–i and higher power logic 397a–i may allow power supplied to at least those portions of the interface logic that are more closely coupled to memory bus 381 (i.e., portions within lower power logic 396a–i) to be powered down by turning off the logic level power supplied via logic level power line 377 at times when some or all of the signal lines making up memory bus 381 are powered down. At such times when logic level power line 377 is powered down, storage level power line 372 remains turned on to continue supplying storage level power to both higher power logic 397a–i and memory cell arrays 399a–i. Also, in some embodiments, the turning off of logic level power supplied via logic level power line 377 coincides with memory device 390 being placed in a lower power state such as self-refresh mode where at least a portion of higher power logic 397a–i uses the storage level power that continues to be supplied via storage level power line 372 to initiate and/or carry out refresh operations on portions (e.g., pages or rows of memory cells) of corresponding ones of memory cell arrays 399a–i.

As those skilled in the art will recognize, the exact decision of which portions of interface logic are to make up each of lower power logic 396a–i and which portions are to make up each of higher power logic 397a–i may be varied between specific embodiments without departing from the spirit and scope of the claimed invention. In some embodiments, the portions of interface logic making up each of higher power logic 397a–i may be limited to logic needed to carry out refresh operations, possibly including a row address decoder, so that these limited portions of interface logic continue to be supplied with power from storage level power line 372 at times when logic level power line 377 is turned off as part of memory device 390 entering a lower power state. In other embodiments, the design of each of memory cell arrays 399a–i may be such that any portions of interface logic directly coupled to the memory cells must be among those portions making up each of higher power logic 397a–i.

Figure 4:
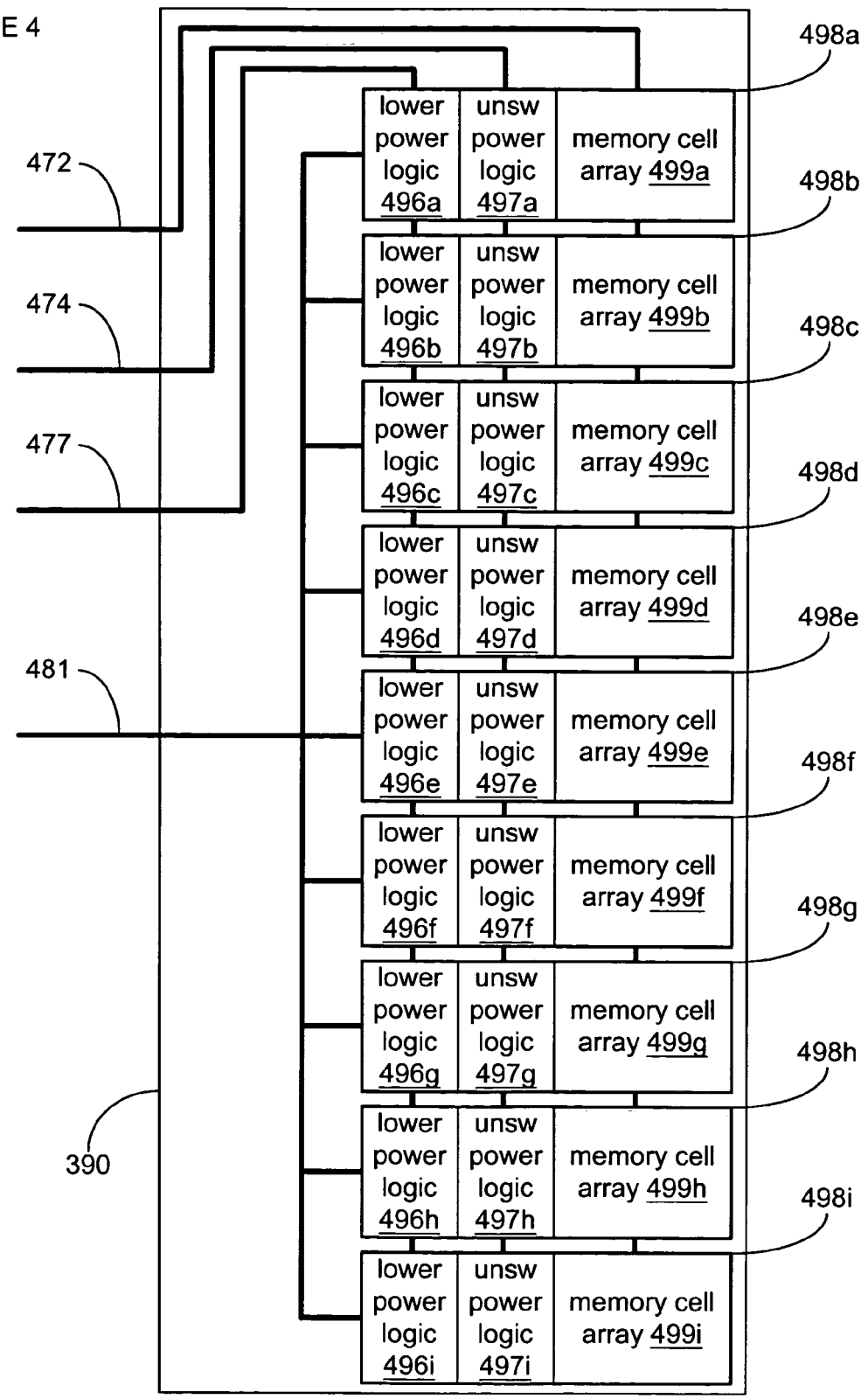
FIG. 4 is a block diagram of another embodiment employing a memory device.

FIG. 4 is a block diagram of another embodiment employing a memory device, with memory device 490 being somewhat similar to memory device 390 of FIG. 3. In various possible embodiments, memory device 490 is made up, at least in part, of memory circuits 498a–i assembled together as ICs on a substrate or as dies within a multiple die package. Also, in some embodiments, memory device 490 is an unbuffered DIMM. Each of memory circuits 498a–i is made up, at least in part, of memory cell arrays 499a–i, unswitched power logic 497a–i and lower power logic 496a–i, respectively. Each of lower power logic 496a–i is coupled to memory bus 481, and together with corresponding ones of unswitched power logic 497a–i, couples corresponding ones of memory arrays 499a–i within memory device 490 to a memory controller and/or other devices (not shown) also coupled to memory bus 481 outside of memory device 390. Lower power logic 496a–i are all supplied with logic level power from logic level power line 477, constant power logic 497a–i are all supplied with unswitched power from unswitched power line 474, and memory cells 499a–i are all supplied with storage level power from storage level power line 472.

Each of memory cell arrays 499a–i is made up of numerous memory cells organized into at least a single two-dimensional array. To ensure the reliable retention of the data stored in these memory cells, the storage level power supplied to each of memory cell arrays 499a–i is of sufficient voltage to allow reliable distinguishing between 0 and 1 bit values of charges stored in memory cells of a capacitor-like configuration, as discussed at length, earlier. Each one of lower power logic 496a–i, together with corresponding ones of unswitched power logic 497a–i, provides the interface logic that carries out commands received from memory bus 481 to either store data within or retrieve data from corresponding ones of memory cell arrays 499a–i, as well as carrying out other various functions. The splitting of this interface logic between lower power and unswitched power logic may, in some embodiments, allow the portions of this interface logic within each of unswitched power logic 497a–i that are more closely coupled to memory cell arrays 499a–i to use a form of unswitched power supplied via unswitched power line 474 having a voltage high enough to interact with corresponding ones of memory cell arrays 499a–i with signaling voltage levels that may be more easily compatible with memory cell arrays 499a–i. At the same time, this same splitting of interface logic may, in some embodiments, allow the portions of this interface logic within each of lower power logic 496a–i that are more closely coupled to memory bus 481 to use the logic level power supplied via logic level power line 477 to interact with memory bus 481 with signaling voltage levels that may be more easily compatible with other devices coupled to memory bus 481. In various implementations, the voltage level of the logic level power supplied via logic level power line 477 is lower than the voltage level of the storage level power supplied via storage level power line 472 in recognition of the possible advantages of using lower voltage signaling across memory bus 481, including lower overall power consumption and shorter signal rise and fall times leading to opportunities to increase the transfer rate of addresses, commands and/or data across memory bus 481.

Also, in some embodiments, the separation of this interface logic between lower power logic 496a–i and unswitched power logic 497a–i may allow power supplied to at least those portions of the interface logic that are more closely coupled to memory bus 481 (i.e., portions within lower power logic 496a–i) to be powered down by turning off the logic level power supplied via logic level power line 477 at times when some or all of the signal lines making up memory bus 481 are powered down. At such times when logic level power line 477 is powered down, both unswitched power line 474 and storage level power line 472 remain turned on to continue supplying unswitched power and storage level power to both unswitched power logic 497a–i and memory cell arrays 499a–i, respectively. Also, in some embodiments, the turning off of logic level power supplied via logic level power line 477 coincides with memory device 490 being placed in a lower power state such as self-refresh mode where at least a portion of unswitched power logic 497a–i uses the unswitched power that continues to be supplied via unswitched power line 474 to initiate and/or carry out refresh operations on portions (e.g., pages or rows of memory cells) of corresponding ones of memory cell arrays 499a–i.

In some embodiments, the voltage level of the unswitched power supplied via unswitched power line 474 is similar to the voltage level of the logic level power supplied via logic level power line 477. In such embodiments, although lower power logic 496a–i and unswitched power logic 497a–i are supplied with power at similar voltage levels such that efficiencies of lower voltage operation of logic circuits may be realized (as described at length, above) the supplying of separate unswitched power and logic level power may be done to allow for the switching off of the logic level power, as described above, while the unswitched power at a similar voltage level continues to be supplied. In other embodiments, the voltage level of the unswitched power supplied via unswitched power line 474 may be chosen to be somewhere between the voltage levels of the logic level power and storage level power so as to allow unswitched power logic 497a–i to operate with signaling levels chosen to be more easily compatible with both lower power logic 496a–i and memory cell arrays 499a–i, respectively.

As those skilled in the art will recognize, the exact decision of which portions of interface logic are to make up each of lower power logic 496a–i and which portions are to make up each of unswitched power logic 497a–i may be varied between specific embodiments without departing from the spirit and scope of the claimed invention. In some embodiments, the portions of interface logic making up each of unswitched power logic 497a–i may be limited to logic needed to carry out refresh operations, possibly including a row address decoder, so that these limited portions of interface logic continue to be supplied with power from unswitched power line 474 at times when logic level power line 477 is turned off as part of memory device 490 entering a lower power state.

Figure 5:
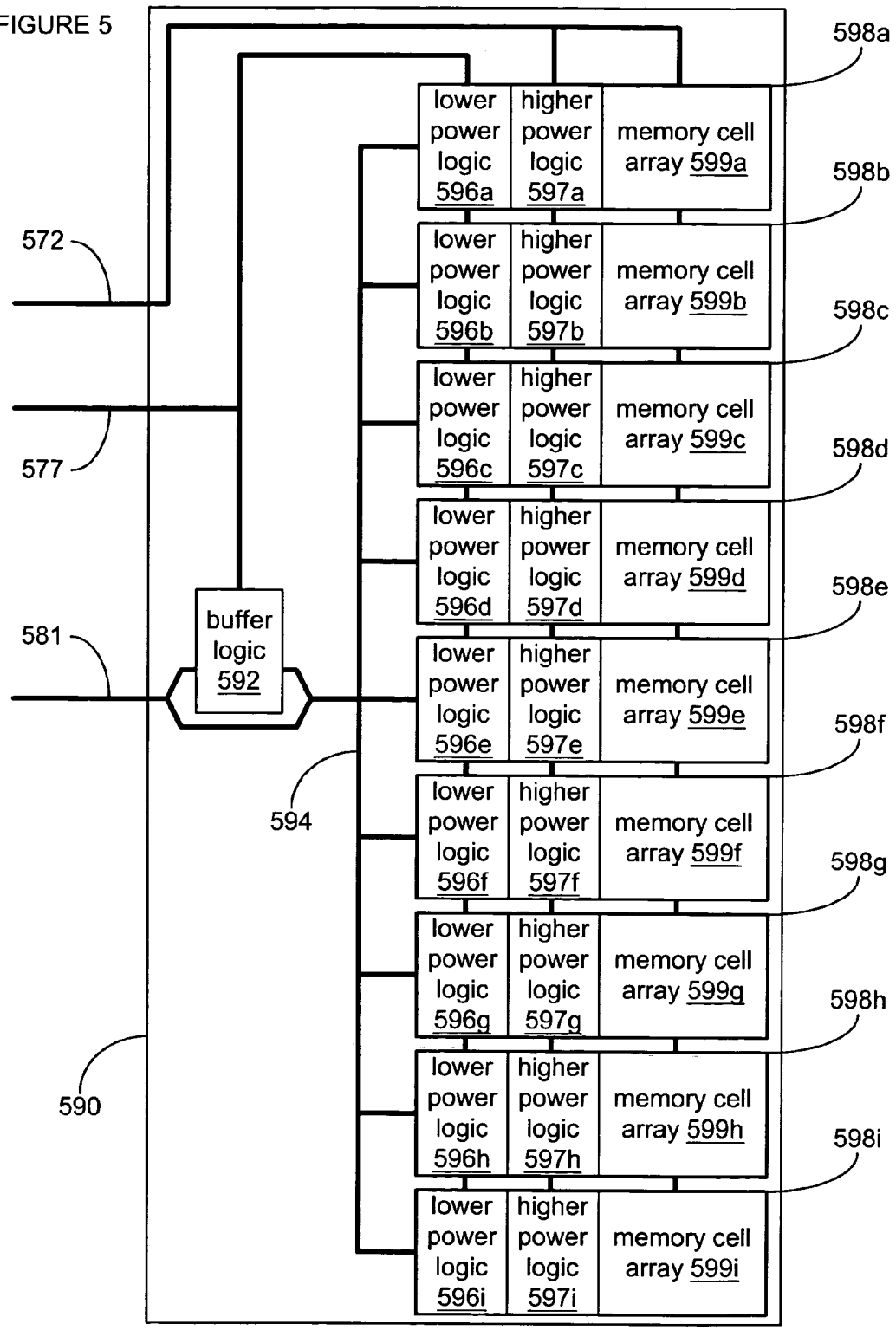
FIG. 5 is a block diagram of still another embodiment employing a memory device.

FIG. 5 is a block diagram of still another embodiment employing a memory device, with memory device 590 being largely identical to memory device 390 of FIG. 3 except for the addition of buffer logic 592 separating some of the signals of memory bus 581 from other portions of memory device 590, effectively creating two memory buses 581 and 594 where some of the signals are buffered and/or latched between memory buses 581 and 594, while other signals are directly connected between memory buses 581 and 594. In some embodiments, memory device 590 is a registered DIMM where address and/or command signals are buffered and/or latched through buffer logic 592, while data signals are directly connected between memory buses 581 and 594. Like memory device 390 of FIG. 3, in various embodiments, memory device 590 is made up, at least in part, of memory circuits 598*a–i* assembled together as ICs on a substrate or as dies within a multiple die package, and buffer logic 592. Each of memory circuits 598*a–i* is made up, at least in part, of memory cell arrays 599*a–i*, higher power logic 597*a–i* and lower power logic 596*a–i*, respectively. Both buffer logic 592 and lower power logic 596*a–i* are all supplied with logic level power from logic level power line 577, and both higher power logic 597*a–i* and memory cells 599*a–i* are all supplied with storage level power from storage level power line 572.

To ensure the reliable retention of the data stored in these memory cells, the storage level power supplied to each of memory cell arrays 599*a–i* is of sufficient voltage to allow reliable distinguishing between 0 and 1 bit values of charges stored in memory cells of a capacitor-like configuration, as discussed at length, earlier. Each one of lower power logic 596*a–i*, together with corresponding ones of higher power logic 597*a–i*, provides the interface logic that carries out commands received through memory buses 581 and 594 to either store data within or retrieve data from corresponding ones of memory cell arrays 599*a–i*, as well as carrying out other various functions. The splitting of this interface logic between lower power and higher power logic may, in some embodiments, allow the portions of this interface logic within each of higher power logic 597*a–i* that are more closely coupled to memory cell arrays 599*a–i* to use the storage level power supplied via storage level power line 572 to interact with corresponding ones of memory cell arrays 599*a–i* with signaling voltage levels that may be more easily compatible with memory cell arrays 599*a–i*. At the same time, this same splitting of interface logic may, in some embodiments, allow the portions of this interface logic within each of lower power logic 596*a–i* that are more closely coupled to buffer logic 592 and/or memory buses 581 and/or 594 to use the logic level power supplied via logic level power line 577 to interact with buffer logic 592 and/or memory buses 581 and/or 594 with signaling voltage levels that may be more easily compatible with buffer logic 592 and/or other devices coupled to memory bus 581 and/or 594. In various implementations, the voltage level of the logic level power supplied via logic level power line 577 is lower than the voltage level of the storage level power supplied via storage level power line 572 in recognition of the possible advantages of using lower voltage signaling with buffer logic 592 and/or across memory bus 581 and/or 594, including lower overall power consumption and shorter signal rise and fall times leading to opportunities to increase the transfer rate of addresses, commands and/or data across memory buses 581 and/or 594.

Also, in some embodiments, the separation of this interface logic between lower power logic 596*a–i* and higher power logic 597*a–i* may allow power supplied to at least those portions of the interface logic that are more closely coupled to buffer logic 592 and/or memory buses 581 and/or 594 (i.e., portions within lower power logic 596*a–i*) to be powered down by turning off the logic level power supplied via logic level power line 577 at times when some or all of the signal lines making up memory bus 581 are powered down. At such times when logic level power line 577 is powered down, storage level power line 572 remains turned on to continue supplying storage level power to both higher power logic 597*a–i* and memory cell arrays 599*a–i*. Also, in some embodiments, the turning off of logic level power supplied via logic level power line 577 coincides with memory device 590 being placed in a lower power state such as self-refresh mode where at least a portion of higher power logic 597*a–i* uses the storage level power that continues to be supplied via storage level power line 572 to initiate and/or carry out refresh operations on portions (e.g., pages or rows of memory cells) of corresponding ones of memory cell arrays 599*a–i*.

As was the case with memory device 390 of FIG. 3, those skilled in the art will recognize that the exact decision of which portions of interface logic are to make up each of lower power logic 596*a–i* and which portions are to make up each of higher power logic 597*a–i* may be varied between specific embodiments without departing from the spirit and scope of the claimed invention. In some embodiments, the portions of interface logic making up each of higher power logic 597*a–i* may be limited to logic needed to carry out refresh operations, possibly including a row address decoder, so that these limited portions of interface logic continue to be supplied with power from storage level power line 572 at times when logic level power line 577 is turned off as part of memory device 590 entering a lower power state. In other embodiments, the design of each of memory cell arrays 599*a–i* may be such that any portions of interface logic directly coupled to the memory cells must be among those portions making up each of higher power logic 597*a–i*.

Figure 6:
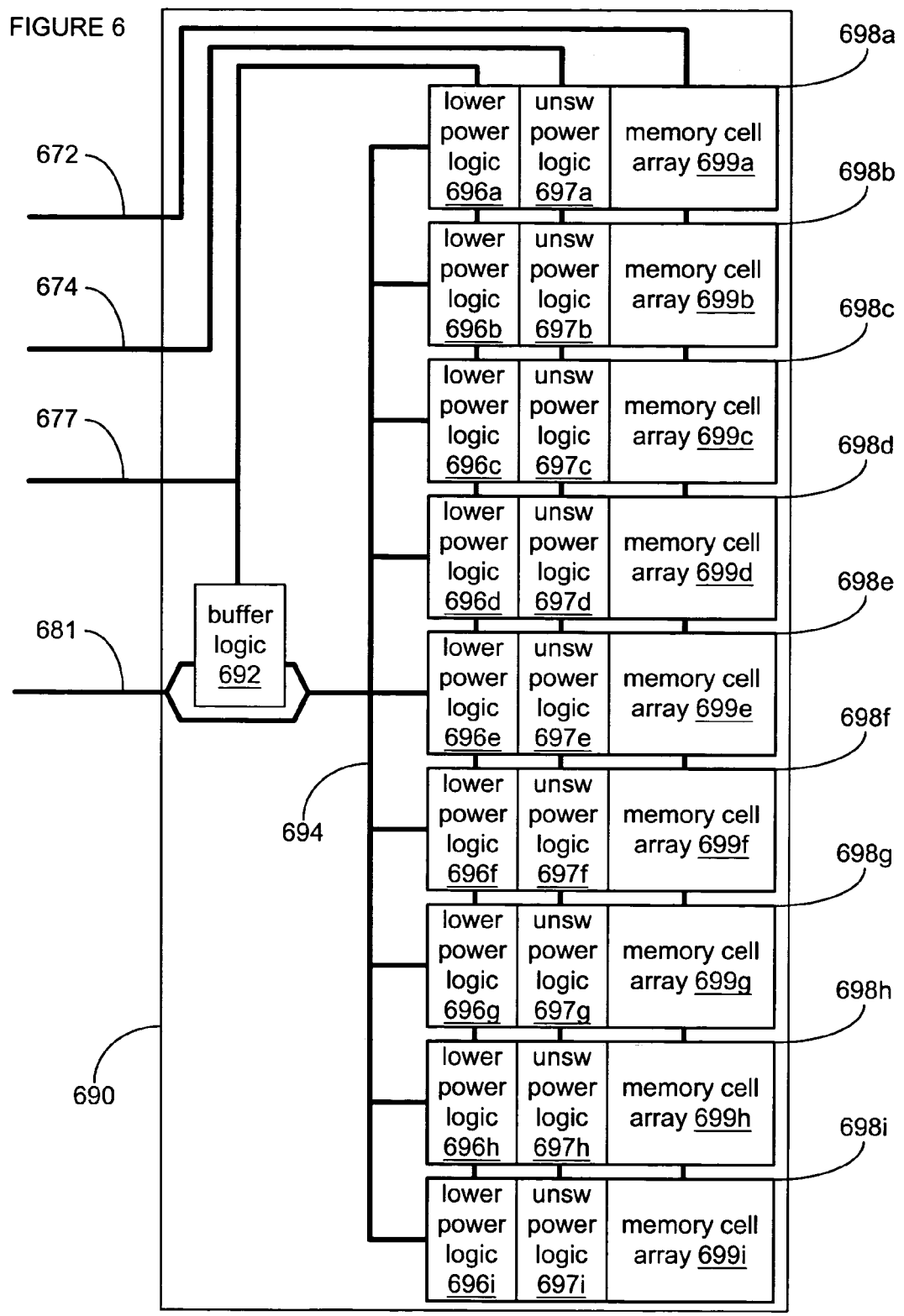
FIG. 6 is a block diagram of yet another embodiment employing a memory device.

FIG. 6 is a block diagram of yet another embodiment employing a memory device, with memory device 690 being largely identical to memory device 490 of FIG. 4 except for the addition of buffer logic 692 separating some of the signals of memory bus 681 from other portions of memory device 690, effectively creating two memory buses 681 and 694 where some of the signals are buffered and/or latched between memory buses 681 and 694, while other signals are directly connected between memory buses 681 and 694. In some embodiments, memory device 690 is a registered DIMM where address and/or command signals are buffered and/or latched through buffer logic 692, while data signals are directly connected between memory buses 681 and 694. Like memory device 490 of FIG. 4, in various embodiments, memory device 690 is made up, at least in part, of memory circuits 698*a–i* assembled together as ICs on a substrate or as dies within a multiple die package, and buffer logic 692. Each of memory circuits 698*a–i* is made up, at least in part, of memory cell arrays 699*a–i*, unswitched power logic 697*a–i* and lower power logic 696*a–i*, respectively. Both buffer logic 692 and lower power logic 696*a–i* are all supplied with logic level power from logic level power line 677, constant power logic 697*a–i* are all supplied with unswitched power from unswitched power line 674, and memory cells 699*a–i* are all supplied with storage level power from storage level power line 672.

To ensure the reliable retention of the data stored in these memory cells, the storage level power supplied to each of memory cell arrays 699*a–i* is of sufficient voltage to allow reliable distinguishing between 0 and 1 bit values of charges stored in memory cells of a capacitor-like configuration, as discussed at length, earlier. Each one of lower power logic 696*a–i*, together with corresponding ones of unswitched power logic 697*a–i*, provides the interface logic that carries out commands received through memory buses 681 and 694 to either store data within or retrieve data from corresponding ones of memory cell arrays 699*a–i*, as well as carrying out other various functions. The splitting of this interface logic between lower power and unswitched power logic may, in some embodiments, allow the portions of this interface logic within each of unswitched power logic 697*a–i* that are more closely coupled to memory cell arrays 699*a–i* to use a form of unswitched power supplied via unswitched power line 674 having a voltage high enough to interact with corresponding ones of memory cell arrays 699*a–i* with signaling voltage levels that may be more easily compatible with memory cell arrays 699*a–i*. At the same time, this same splitting of interface logic may, in some embodiments, allow the portions of this interface logic within each of lower power logic 696*a–i* that are more closely coupled to buffer logic 692 and/or memory buses 681 and/or 694 to use the logic level power supplied via logic level power line 677 to interact with buffer logic 692 and/or memory buses 681 and/or 694 with signaling voltage levels that may be more easily compatible with buffer logic 692 and/or other devices coupled to memory bus 681 and/or 694. In various implementations, the voltage level of the logic level power supplied via logic level power line 677 is lower than the voltage level of the storage level power supplied via storage level power line 672 in recognition of the possible advantages of using lower voltage signaling across memory buses 681 and/or 694, including lower overall power consumption and shorter signal rise and fall times leading to opportunities to increase the transfer rate of addresses, commands and/or data across memory buses 681 and/or 694.

Also, in some embodiments, the separation of this interface logic between lower power logic 696*a–i* and unswitched power logic 697*a–i* may allow power supplied to at least those portions of the interface logic that are more closely coupled to buffer logic 692 and/or memory bus 681 and/or 694 (i.e., portions within lower power logic 696*a–i*) to be powered down by turning off the logic level power supplied via logic level power line 677 at times when some or all of the signal lines making up memory bus 681 are powered down. At such times when logic level power line 677 is powered down, both unswitched power line 674 and storage level power line 672 remain turned on to continue supplying unswitched power and storage level power to both unswitched power logic 697*a–i* and memory cell arrays 699*a–i*, respectively. Also, in some embodiments, the turning off of logic level power supplied via logic level power line 677 coincides with memory device 690 being placed in a lower power state such as self-refresh mode where at least a portion of unswitched power logic 697*a–i* uses the unswitched power that continues to be supplied via unswitched power line 674 to initiate and/or carry out refresh operations on portions (e.g., pages or rows of memory cells) of corresponding ones of memory cell arrays 699*a–i*.

In some embodiments, the voltage level of the unswitched power supplied via unswitched power line 674 is similar to the voltage level of the logic level power supplied via logic level power line 677. In such embodiments, although lower power logic 696*a–i* and unswitched power logic 697*a–i* are supplied with power at similar voltage levels such that efficiencies of lower voltage operation of logic circuits may be realized (as described at length, above) the supplying of separate unswitched power and logic level power may be done to allow for the switching off of the logic level power, as described above, while the unswitched power at a similar voltage level continues to be supplied. In other embodiments, the voltage level of the unswitched power supplied via unswitched power line 674 may be chosen to be somewhere between the voltage levels of the logic level power and storage level power so as to allow unswitched power logic 697*a–i* to operate with signaling levels chosen to be more easily compatible with both lower power logic 696*a–i* and memory cell arrays 699*a–i*, respectively.

As those skilled in the art will recognize, the exact decision of which portions of interface logic are to make up each of lower power logic 696*a–i* and which portions are to make up each of unswitched power logic 697*a–i* may be varied between specific embodiments without departing from the spirit and scope of the claimed invention. In some embodiments, the portions of interface logic making up each of unswitched power logic 697*a–i* may be limited to logic needed to carry out refresh operations, possibly including a row address decoder, so that these limited portions of interface logic continue to be supplied with power from unswitched power line 674 at times when logic level power line 677 is turned off as part of memory device 690 entering a lower power state.

Figure 7:
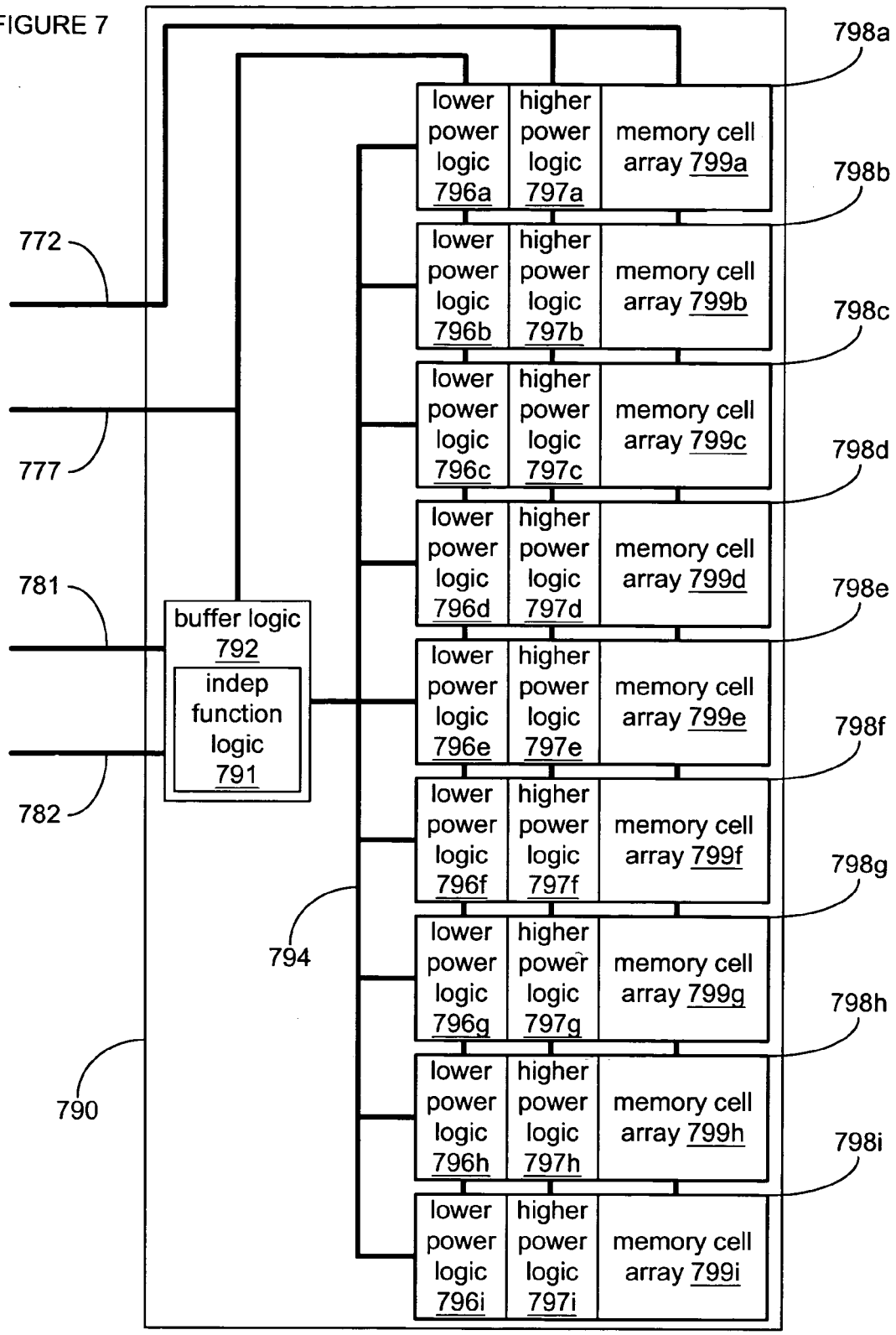
FIG. 7 is a block diagram of an embodiment employing a memory device having a point-to-point interface.

FIG. 7 is a block diagram of still another embodiment employing a memory device, with memory device 790 being largely identical to memory device 590 of FIG. 5 except for the replacement of buffer logic 592 in memory device 590 with buffer logic 792 having a pair of point-to-point interfaces in memory device 790. The point-to-point interfaces of buffer logic 792 couple memory bus 794 of memory device 790 with memory busses 781 and 782, allowing memory device 790 to be coupled to one or two other devices making up a memory system, including memory controllers and/or other memory devices. Such point-to-point interfaces may be made up of sets of unidirectional signal lines (perhaps matched sets in opposite directions) and/or at least one set of bidirectional signal lines. In various embodiments, memory device 790 is made up, at least in part, of memory circuits 798*a–i* assembled together as ICs on a substrate or as dies within a multiple die package, and buffer logic 792. In some embodiments, memory device 790 is a fully buffered DIMM. Like memory device 590 of FIG. 5, each of memory circuits 798*a–i* is made up, at least in part, of memory cell arrays 799*a–i*, higher power logic 797*a–i* and lower power logic 796*a–i*, respectively. Each of lower power logic 796*a–i* is coupled to memory buses 781 and 782 through buffer logic 792 and memory bus 794 for access to at least the majority of the signal lines making up memory buses 781 and 782, although there may be a smaller number of signals making memory buses 781 and/or 782 to which each of lower power logic 796*a–i* may be directly coupled. Both buffer logic 792 and lower power logic 796*a–i* are all supplied with logic level power from logic level power line 777, and both higher power logic 797*a–i* and memory cells 799*a–i* are all supplied with storage level power from storage level power line 772.

To ensure the reliable retention of the data stored in these memory cells, the storage level power supplied to each of memory cell arrays 799*a–i* is of sufficient voltage to allow reliable distinguishing between 0 and 1 bit values of charges stored in memory cells of a capacitor-like configuration, as discussed at length, earlier. Each one of lower power logic 796*a–i*, together with corresponding ones of higher power logic 797*a–i*, provides the interface logic that carries out commands received through memory buses 781, 782 and/or 794 to either store data within or retrieve data from corresponding ones of memory cell arrays 799*a–i*, as well as carrying out other various functions. The splitting of this interface logic between lower power and higher power logic may, in some embodiments, allow the portions of this interface logic within each of higher power logic 797*a–i* that are more closely coupled to memory cell arrays 799*a–i* to use the storage level power supplied via storage level power line 772 to interact with corresponding ones of memory cell arrays 799*a–i* with signaling voltage levels that may be more easily compatible with memory cell arrays 799*a–i*. At the same time, this same splitting of interface logic may, in some embodiments, allow the portions of this interface logic within each of lower power logic 796a–i that are more closely coupled to buffer logic 792 and/or memory buses 781, 782 and/or 794 to use the logic level power supplied via logic level power line 777 to interact with buffer logic 792 and/or memory buses 781, 782 and/or 794 with signaling voltage levels that may be more easily compatible with buffer logic 792 and/or other devices coupled to memory buses 781, 782 and/or 794. In various implementations, the voltage level of the logic level power supplied via logic level power line 777 is lower than the voltage level of the storage level power supplied via storage level power line 772 in recognition of the possible advantages of using lower voltage signaling with buffer logic 792 and/or across memory buses 781 and/or 782, including lower overall power consumption and shorter signal rise and fall times leading to opportunities to increase the transfer rate of addresses, commands and/or data across memory buses 781, 782 and/or 794.

Also, in some embodiments, the separation of this interface logic between lower power logic 796a–i and higher power logic 797a–i may allow power supplied to at least those portions of the interface logic that are more closely coupled to buffer logic 792 and/or memory buses 781, 782 and/or 794 (i.e., portions within lower power logic 796a–i) to be powered down by turning off the logic level power supplied via logic level power line 777 at times when some or all of the signal lines making up memory buses 781 and/or 782 are powered down. At such times when logic level power line 777 is powered down, storage level power line 772 remains turned on to continue supplying storage level power to both higher power logic 797a–i and memory cell arrays 799a–i. Also, in some embodiments, the turning off of logic level power supplied via logic level power line 777 coincides with memory device 790 being placed in a lower power state such as self-refresh mode where at least a portion of higher power logic 797a–i uses the storage level power that continues to be supplied via storage level power line 772 to initiate and/or carry out refresh operations on portions (e.g., pages or rows of memory cells) of corresponding ones of memory cell arrays 799a–i.

As was the case with memory device 590 of FIG. 5, those skilled in the art will recognize that the exact decision of which portions of interface logic are to make up each of lower power logic 796a–i and which portions are to make up each of higher power logic 797a–i may be varied between specific embodiments without departing from the spirit and scope of the claimed invention. In some embodiments, the portions of interface logic making up each of higher power logic 797a–i may be limited to logic needed to carry out refresh operations, possibly including a row address decoder, so that these limited portions of interface logic continue to be supplied with power from storage level power line 772 at times when logic level power line 777 is turned off as part of memory device 790 entering a lower power state. In other embodiments, the design of each of memory cell arrays 799a–i may be such that any portions of interface logic directly coupled to the memory cells must be among those portions making up each of higher power logic 797a–i.

Figure 8:
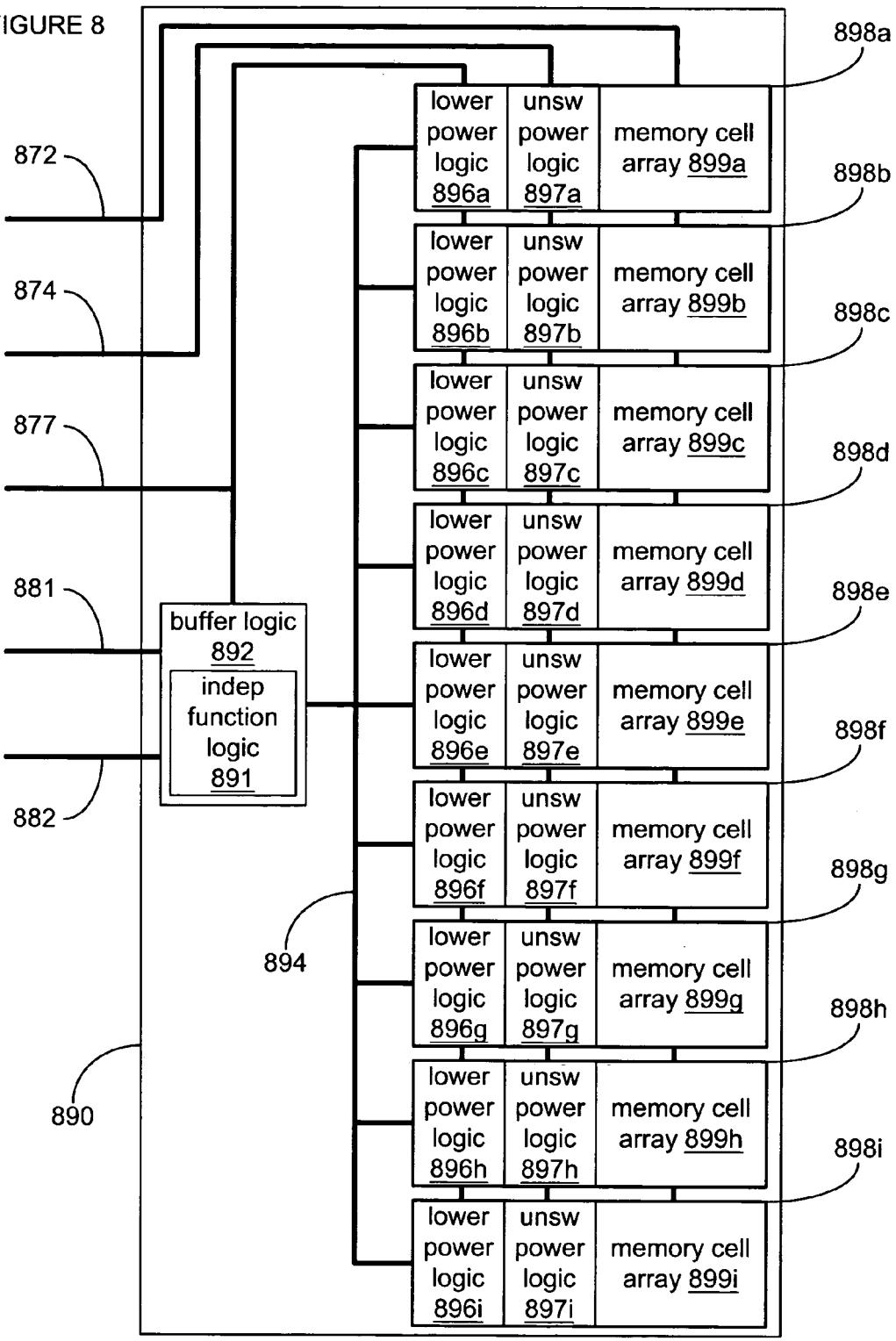
FIG. 8 is a block diagram of another embodiment employing a memory device having a point-to-point interface.

FIG. 8 is a block diagram of yet another embodiment employing a memory device, with memory device 890 being largely identical to memory device 690 of FIG. 6 except for the replacement of buffer logic 692 in memory device 690 with buffer logic 892 having a pair of point-to-point interfaces in memory device 890. The point-to-point interfaces of buffer logic 892 couple memory bus 894 of memory device 890 with memory busses 881 and 882, allowing memory device 890 to be coupled to one or two other devices making up a memory system, including memory controllers and/or other memory devices. Such point-to-point interfaces may be made up of sets of unidirectional signal lines (perhaps matched sets in opposite directions) and/or at least one set of bidirectional signal lines. In various embodiments, memory device 890 is made up, at least in part, of memory circuits 898a–i assembled together as ICs on a substrate or as dies within a multiple die package, and buffer logic 892. In some embodiments, memory device 890 is a fully buffered DIMM. Like memory device 690 of FIG. 6, each of memory circuits 898a–i is made up, at least in part, of memory cell arrays 899a–i, unswitched power logic 897a–i and lower power logic 896a–i, respectively. Each of lower power logic 896a–i is coupled to memory buses 881 and 882 through buffer logic 892 and memory bus 894 for access to at least the majority of the signal lines making up memory buses 881 and 882, although there may be a smaller number of signals making up memory buses 881 and/or 882 to which each of lower power logic 896a–i may be directly coupled. Both buffer logic 892 and lower power logic 896a–i are all supplied with logic level power from logic level power line 877, constant power logic 897a–i are all supplied with unswitched power from unswitched power line 874, and memory cells 899a–i are all supplied with storage level power from storage level power line 872.

To ensure the reliable retention of the data stored in these memory cells, the storage level power supplied to each of memory cell arrays 899a–i is of sufficient voltage to allow reliable distinguishing between 0 and 1 bit values of charges stored in memory cells of a capacitor-like configuration, as discussed at length, earlier. Each one of lower power logic 896a–i, together with corresponding ones of unswitched power logic 897a–i, provides the interface logic that carries out commands received through memory buses 881, 882 and/or 894 to either store data within or retrieve data from corresponding ones of memory cell arrays 899a–i, as well as carrying out other various functions. The splitting of this interface logic between lower power and unswitched power logic may, in some embodiments, allow the portions of this interface logic within each of unswitched power logic 897a–i that are more closely coupled to memory cell arrays 899a–i to use a form of unswitched power supplied via unswitched power line 874 having a voltage high enough to interact with corresponding ones of memory cell arrays 899a–i with signaling voltage levels that may be more easily compatible with memory cell arrays 899a–i. At the same time, this same splitting of interface logic may, in some embodiments, allow the portions of this interface logic within each of lower power logic 896a–i that are more closely coupled to buffer logic 892 and/or memory buses 881, 882 and/or memory bus 894 to use the logic level power supplied via logic level power line 877 to interact with buffer logic 892 and/or memory buses 881, 882 and/or 894 with signaling voltage levels that may be more easily compatible with buffer logic 892 and/or other devices coupled to memory buses 881 and/or 882. In various implementations, the voltage level of the logic level power supplied via logic level power line 877 is lower than the voltage level of the storage level power supplied via storage level power line 872 in recognition of the possible advantages of using lower voltage signaling across memory buses 881, 882 and/or 894, including lower overall power consumption and shorter signal rise and fall times leading to opportunities to increase the transfer rate of addresses, commands and/or data across memory buses 881, 882 and/or 894.

Also, in some embodiments, the separation of this interface logic between lower power logic 896a–i and unswitched power logic 897*a–i* may allow power supplied to at least those portions of the interface logic that are more closely coupled to buffer logic 892 and/or memory buses 881, 882 and/or 894 (i.e., portions within lower power logic 696*a–i*) to be powered down by turning off the logic level power supplied via logic level power line 877 at times when some or all of the signal lines making up memory buses 881 and/or 882 are powered down. At such times when logic level power line 877 is powered down, both unswitched power line 874 and storage level power line 872 remain turned on to continue supplying unswitched power and storage level power to both unswitched power logic 897*a–i* and memory cell arrays 899*a–i*, respectively. Also, in some embodiments, the turning off of logic level power supplied via logic level power line 877 coincides with memory device 890 being placed in a lower power state such as self-refresh mode where at least a portion of unswitched power logic 897*a–i* uses the unswitched power that continues to be supplied via unswitched power line 874 to initiate and/or carry out refresh operations on portions (e.g., pages or rows of memory cells) of corresponding ones of memory cell arrays 899*a–i*.

In some embodiments, the voltage level of the unswitched power supplied via unswitched power line 874 is similar to the voltage level of the logic level power supplied via logic level power line 877. In such embodiments, although lower power logic 896*a–i* and unswitched power logic 897*a–i* are supplied with power at similar voltage levels such that efficiencies of lower voltage operation of logic circuits may be realized (as described at length, above) the supplying of separate unswitched power and logic level power may be done to allow for the switching off of the logic level power, as described above, while the unswitched power at a similar voltage level continues to be supplied. In other embodiments, the voltage level of the unswitched power supplied via unswitched power line 874 may be chosen to be somewhere between the voltage levels of the logic level power and storage level power so as to allow unswitched power logic 897*a–i* to operate with signaling levels chosen to be more easily compatible with both lower power logic 896*a–i* and memory cell arrays 899*a–i*, respectively.

As those skilled in the art will recognize, the exact decision of which portions of interface logic are to make up each of lower power logic 896*a–i* and which portions are to make up each of unswitched power logic 897*a–i* may be varied between specific embodiments without departing from the spirit and scope of the claimed invention. In some embodiments, the portions of interface logic making up each of unswitched power logic 897*a–i* may be limited to logic needed to carry out refresh operations, possibly including a row address decoder, so that these limited portions of interface logic continue to be supplied with power from unswitched power line 874 at times when logic level power line 877 is turned off as part of memory device 890 entering a lower power state.

It should be noted that as those skilled in the art of the design of memory devices, including DRAM devices, will readily recognize, FIGS. 3 through 8 provide a relatively simple depiction of components making up a DRAM device, and that the exact arrangement and configuration of components within a DRAM device may be reduced, augmented or otherwise altered in comparison to what is depicted within those figures without departing from the spirit and scope of the present invention as hereinafter claimed. Specifically, as those skilled in the art will readily recognize, a quantity of memory circuits other than what is depicted in FIGS. 3 through 8 is certainly possible without departing from the spirit and scope of the claimed invention. Also, specifically, although embodiments specifically employing 2 and 3 power connections/sources have been depicted and discussed, it will be understood by those skilled in the art that 4 or more power connections/sources may be employed to provide power to various subparts of a memory device without departing from the spirit and scope of the claimed invention.

Figure 9:
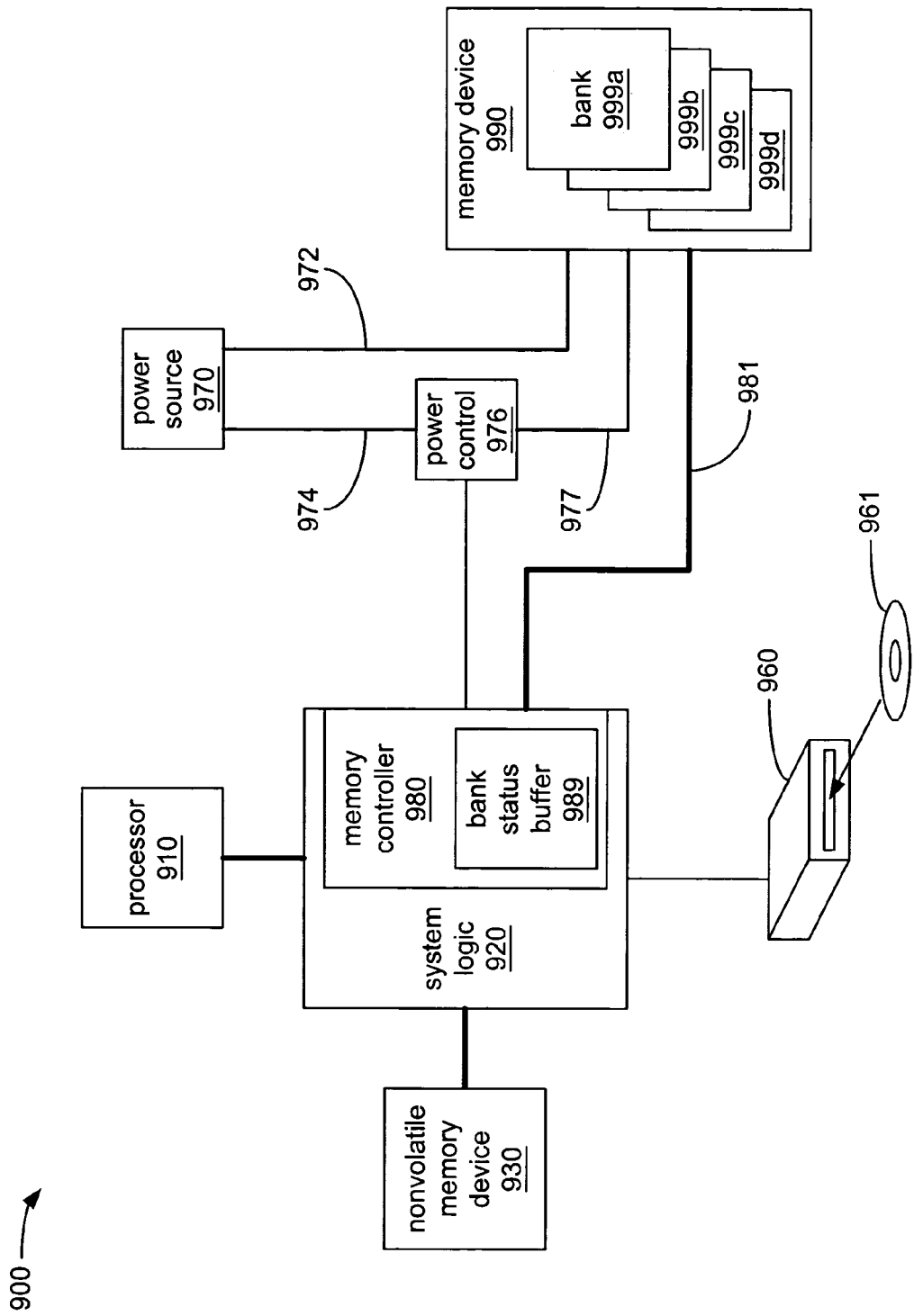
FIG. 9 is a block diagram of another embodiment employing a computer system.

FIG. 9 is a block diagram of an embodiment employing a computer system. Computer system 900 is, at least in part, made up of processor 910, system logic 920, and memory device 990. System logic 920 is coupled to processor 910 and performs various functions in support of processor 910 including providing processor 910 with access to memory device 990 to which system logic 920 is also coupled, using memory controller 980 within system logic 920. Processor 910, system logic 920 and memory device 990 make up a form of core for computer system 900 that is capable of supporting the execution of machine readable instructions by processor 910 and the storage of data and instructions within memory device 990. Alternatively, in other embodiments, memory controller 980 may be either partially or entirely integrated within processor 910, with the possible result of processor 910 being directly coupled to and having direct access to memory device 990.

In various embodiments, processor 910 could be any of a variety of types of processor including a processor capable of executing at least a portion of the widely known and used "x86" instruction set, and in other various embodiments, there could be more than one processor. In various embodiments, memory device 990 could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 980 provides logic 920 with an appropriate interface for the type of memory. At least a portion of the memory cells of memory device 990 are divided into banks 999*a–d*, each of which are made up of memory cells organized into rows and columns in a two dimensional memory array. To access a portion of the memory cells within memory device 990, that portion must be addressed by memory controller 980 with a combination of bank, row and column addresses. As those skilled in the art will recognize, the depiction of a single memory device 990 with four banks of memory cells, namely banks 999*a*–999*d*, is but an example of a memory system that could be a part of a computer system, and that a larger number of memory devices and/or a differing number of banks within memory devices could be used without departing from the spirit and scope of the present invention as hereinafter claimed.

In some embodiments, system logic 920 is coupled to and provides processor 910 with access to storage device 960 by which data and/or instructions carried by storage media 961 may be accessed. Storage media 961 may be of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 930 is coupled to system logic 920 (or other part of computer system 900) and provides storage for an initial series of instructions executed at a time when computer system 900 is either "reset" or initialized (for example, when computer system 900 is "turned on" or "powered up") to perform tasks needed to prepare computer system 900 for normal use. In some variations of such embodiments, upon initialization or resetting of computer system 900, processor 910 accesses nonvolatile memory device 930 to retrieve instructions to be executed to prepare memory controller 970 for normal use in providing access for CPU 910 to memory device 990. It may be that these same retrieved instructions are executed to prepare system logic 920 for normal use in providing access to storage device 960 and whatever form of storage media 961 that may be used by storage device 960.

In some embodiments, computer system 900 is further made up of power source 970 supplying logic level power through power line 974, power control 976 and power line 977 to a portion of memory device 990, and supplying storage level power through power line 972 to another portion of memory device 990. In some variants of such embodiments, power control 976 may be operated by logic making up a portion of memory controller 980, and in other variants, power control 976 may be operated by another portion within a memory system making up computer system 900 or elsewhere within computer system 900, such as logic dedicated to the function of controlling the distribution of power.

In some embodiments, storage media 961 carries machine-accessible instructions to be executed by processor 910 to cause processor 910 to carry out one or more tests of memory device 990 to determine what type of DRAM device memory device 990 may be, and/or to determine what functions memory device 990 may support. Such tests may include a series of attempted accesses to portions of memory device 990 and observation of the nature of the responses, received. Alternatively, such tests may include interrogating a code identifying the type of memory device or identifying the presence of one or more features, or such tests may entail reading data stored in a portion of nonvolatile memory within memory device 990 identifying the type of memory device, various parameters, and/or the presence or absence of various features. If it is determined that memory device 990 supports the use of a segmented power supply, as described at length above, then processor 910 may be caused to program or otherwise configure memory controller 980 and/or other logic within computer system 900 to operate power control 976 to make use of such a capability.

In other embodiments, a characteristic of the design of computer system 900, such as the physical design of a connector by which memory device 990 is coupled to the rest of computer system 900, may preclude the use of memory devices that do not support the use of a segmented power supply. In such embodiments, it may then be presumed that any memory device, such as memory device 990, that could be connected to the rest of computer system 900 would, therefore, necessarily support a segmented power system, and so processor 910 may be caused to execute instructions to prepare the use of power control 976 to selectively supply a portion of memory device 990 with power without having carried out a test to confirm that memory device 990 supports a segmented power supply.

The invention has been described in conjunction with various possible embodiments. It is evident that numerous alternatives, modifications, variations and uses will be apparent to those skilled in the art in light of the foregoing description. It will be understood by those skilled in the art that the present invention may be practiced in support of various types of electronic devices with various possible memory devices in which the memory cells repeatedly require some form of "refreshing" or other regular maintenance activity in order to prevent the loss of data. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. A DRAM IC comprising:
a first external connection to receive a first power supply voltage;
a second external connection to receive a second power supply voltage that is lower in voltage than the first power supply voltage;
a plurality of memory cells organized into a two-dimensional array to store data, wherein the memory cells are powered by the first power supply voltage, receive and output data through a plurality of bit lines coupled to the plurality of memory cells, and are controlled through a plurality of word lines coupled to the plurality of memory cells;
a first logic directly coupled to the memory cells to at least transmit signals to the memory cells, wherein the first logic is powered by the first power supply voltage; and
a second logic coupled to the first logic to provide an external interface to receive commands and addresses to select memory cells from among the plurality of memory cells for access, and to both receive data to store within and output data retrieved from the selected memory cells, wherein the second logic is powered by the second power supply voltage;
wherein the first logic includes refresh logic to operate the plurality of word lines to carry out refresh operations to preserve data stored within the plurality of memory cells while the DRAM IC is placed in a lower power state in which the second logic is deprived of power as a result of the second power supply voltage being removed.

2. The DRAM IC of claim 1, wherein the first logic is coupled to the plurality of bit lines, and both transmits data across the plurality bit lines to the plurality of memory cells and receives data from across the plurality of bit lines from the memory cells.

3. The DRAM IC of claim 1, wherein the first logic is coupled to the plurality of word lines and transmits row activation signals across the plurality of word lines to the plurality of memory cells.

4. A DRAM IC comprising:
a first external connection to receive a first power supply voltage;
a second external connection to receive a second power supply voltage that is lower in voltage than the first power supply voltage;
a third external connection to receive a third power supply voltage that is lower in voltage than the first power supply voltage;
a plurality of memory cells organized into a two-dimensional array to store data, wherein the memory cells are powered by the first power supply voltage, receive and output data through a plurality of bit lines coupled to the plurality of memory cells, and are controlled through a plurality of word lines coupled to the plurality of memory cells;
a first logic directly coupled to the memory cells to at least transmit signals to the memory cells, wherein the first logic is powered by the first power supply voltage;
a second logic coupled to the first logic to control at least a portion of the first logic, wherein the second logic is powered by the second power supply voltage; and a third logic coupled to the first logic to provide an external interface to receive commands and addresses to select memory cells from among the plurality of memory cells for access, and to both receive data to store within and output data retrieved from the selected memory cells, wherein the third logic is powered by the third power supply voltage.

5. The DRAM IC of claim 4, wherein the first logic is coupled to the plurality of bit lines, and both transmits data across the plurality bit lines to the plurality of memory cells and receives data from across the plurality of bit lines from the memory cells.

6. The DRAM IC of claim 4, wherein the first logic is coupled to the plurality of word lines and transmits row activation signals across the plurality of word lines to the plurality of memory cells.

7. The DRAM IC of claim 6, wherein the second logic is comprised of refresh logic to operate the plurality of word lines to carry out refresh operations to preserve data stored within the plurality of memory cells while the DRAM IC is placed in a lower power state in which the third logic is deprived of power as a result of the third power supply voltage being removed.

8. A memory device comprising:
a circuitboard;
a plurality of electrical contacts carried by the circuitboard to couple the circuitboard to a memory bus and to at least a first power supply voltage and a second power supply voltage; and
at least one DRAM IC comprising:
　a plurality of memory cells organized into a two-dimensional array to store data, wherein the memory cells are powered by the first power supply voltage, receive and output data through a plurality of bit lines coupled to the plurality of memory cells, and are controlled through a plurality of word lines coupled to the plurality of memory cells;
　a first logic directly coupled to the memory cells to at least transmit signals to the memory cells, wherein the first logic is powered by the first power supply voltage; and
　a second logic coupled to the first logic to provide an external interface to receive commands and addresses to select memory cells from among the plurality of memory cells for access, and to both receive data to store within and output data retrieved from the selected memory cells, wherein the second logic is powered by the second power supply voltage;
　wherein the first logic includes refresh logic to operate the plurality of word lines to carry out refresh operations to preserve data stored within the plurality of memory cells while the memory device is placed in a lower power state in which the second logic is deprived of power as a result of the second power supply voltage being removed.

9. The memory device of claim 8, wherein the external interface of the at least one DRAM IC is directly coupled to at least a subset of the electrical contacts carried by the circuitboard to further couple the external interface of the at least one DRAM IC to the memory bus.

10. The memory device of claim 8, wherein the first logic is coupled to the plurality of word lines and transmits row activation signals across the plurality of word lines to the plurality of memory cells.

11. The memory device of claim 10, further comprising at least one interposed IC coupled to at least a subset of the electrical contacts carried by the circuitboard and to the external interface of the at least one DRAM IC to at least buffer at least a subset of the signals communicated between the at least one DRAM IC and the memory bus, wherein the at least one interposed IC is powered by the second power supply voltage, and the at least DRAM IC carries out refresh operations to preserve data stored within the plurality of memory cells while the memory device is placed in a lower power state in which the at least one interposed IC is deprived of power as a result of the second power supply voltage being removed.

12. A memory device comprising:
a circuitboard;
a plurality of electrical contacts carried by the circuitboard to couple the circuitboard to a memory bus and to at least a first power supply voltage, a second power supply voltage, and a third power supply voltage; and
at least one DRAM IC comprising:
　a plurality of memory cells organized into a two-dimensional array to store data, wherein the memory cells are powered by the first power supply voltage, receive and output data through a plurality of bit lines coupled to the plurality of memory cells, and are controlled through a plurality of word lines coupled to the plurality of memory cells;
　a first logic directly coupled to the memory cells to at least transmit signals to the memory cells, wherein the first logic is powered by the first power supply voltage;
　a second logic coupled to the first logic to control at least a portion of the first logic, wherein the second logic is powered by the second power supply voltage; and
　a third logic coupled to the first logic to provide an external interface to receive commands and addresses to select memory cells from among the plurality of memory cells for access, and to both receive data to store within and output data retrieved from the selected memory cells, wherein the third logic is powered by the third power supply voltage.

13. The memory device of claim 12, wherein the external interface of the at least one DRAM IC is directly coupled to at least a subset of the electrical contacts carried by the circuitboard to further couple the external interface of the at least one DRAM IC to the memory bus.

14. The memory device of claim 12, wherein the first logic is coupled to the plurality of word lines and transmits row activation signals across the plurality of word lines to the plurality of memory cells.

15. The memory device of claim 14, wherein the second logic is comprised of refresh logic to operate the plurality of word lines to carry out refresh operations to preserve data stored within the plurality of memory cells while the memory device is placed in a lower power state in which the third logic is deprived of power as a result of the third power supply voltage being removed.

16. The memory device of claim 15, further comprising at least one interposed IC coupled to at least a subset of the electrical contacts carried by the circuitboard and to the external interface of the at least one DRAM IC to at least buffer at least a subset of the signals communicated between the at least one DRAM IC and the memory bus, wherein the at least one interposed IC is powered by the third power supply voltage, and the at least one DRAM IC carries out refresh operations to preserve data stored within the plurality of memory cells while the memory device is placed in a lower power state in which the at least one interposed IC is deprived of power as a result of the third power supply voltage being removed.

17. An apparatus comprising:
a processor;
a core logic providing a memory controller coupled to the processor to provide a memory bus;
a first power source providing a first power supply voltage;
a second power source providing a second power supply voltage;
a power control circuit coupled to the core logic to selectively enable provision of the second power supply voltage; and
at least one DRAM IC comprising:
a plurality of memory cells organized into a two-dimensional array to store data, wherein the memory cells are powered by-the first power supply voltage, receive and output data through a plurality of bit lines coupled to the plurality of memory cells, and are controlled through a plurality of word lines coupled to the plurality of memory cells;
a first logic directly coupled to the memory cells to at least transmit signals to the memory cells, wherein the first logic is powered by the first power supply voltage; and
a second logic coupled to the first logic to provide an external interface to receive commands and addresses to select memory cells from among the plurality of memory cells for access, and to both receive data to store within and output data retrieved from the selected memory cells, wherein the second logic is powered by the second power supply voltage;
wherein the first logic includes refresh logic to operate the plurality of word lines to carry out refresh operations to preserve data stored within the plurality of memory cells while the memory device is placed in a lower power state in which the second logic is deprived of power as a result of the second power supply voltage being removed by the power control circuit.

18. The apparatus of claim 17, wherein the external interface of the at least one DRAM IC is directly coupled to the memory bus.

19. The apparatus of claim 17, wherein the first logic is coupled to the plurality of word lines and transmits row activation signals across the plurality of word lines to the plurality of memory cells.

20. The apparatus of claim 19, further comprising at least one interposed IC coupled to at least a subset of the memory bus and to the external interface of the at least one DRAM IC to at least buffer at least a subset of the signals communicated between the at least one DRAM IC and the memory bus, wherein the at least one interposed IC is powered by the second power supply voltage, and the at least one DRAM IC carries out refresh operations to preserve data stored within the plurality of memory cells while the memory device is placed in a lower power state in which the at least one interposed IC is deprived of power as a result of the second power supply voltage being removed by the power control circuit.

21. An apparatus comprising:
a processor;
a core logic providing a memory controller coupled to the processor to provide a memory bus;
a first power source providing a first power supply voltage;
a second power source providing a second power supply voltage;
a third power source providing a third power supply voltage;
a power control circuit coupled to the core logic to selectively enable provision of the third power supply voltage; and
at least one DRAM IC comprising:
a plurality of memory cells organized into a two-dimensional array to store data, wherein the memory cells are powered by the first power supply voltage, receive and output data through a plurality of bit lines coupled to the plurality of memory cells, and are controlled through a plurality of word lines coupled to the plurality of memory cells;
a first logic directly coupled to the memory cells to at least transmit signals to the memory cells, wherein the first logic is powered by the first power supply voltage;
a second logic coupled to the first logic to control at least a portion of the first logic, wherein the second logic is powered by the second power supply voltage; and
a third logic coupled to the first logic to provide an external interface to receive commands and addresses to select memory cells from among the plurality of memory cells for access, and to both receive data to store within and output data retrieved from the selected memory cells, wherein the third logic is powered by the third power supply voltage.

22. The apparatus of claim 21, wherein the external interface of the at least one DRAM IC is directly coupled to the memory bus.

23. The apparatus of claim 21, wherein the first logic is coupled to the plurality of word lines and transmits row activation signals across the plurality of word lines to the plurality of memory cells.

24. The apparatus of claim 23, wherein the second logic is comprised of refresh logic control the at least a portion of the first logic to operate the plurality of word lines to carry out refresh operations to preserve data stored within the plurality of memory cells while the memory device is placed in a lower power state in which the third logic is deprived of power as a result of the third power supply voltage being removed by the power control circuit.

25. The apparatus of claim 24, further comprising at least one interposed IC coupled to at least a subset of the electrical contacts carried by the circuitboard and to the external interface of the at least one DRAM IC to at least buffer at least a subset of the signals communicated between the at least one DRAM IC and the memory bus, wherein the at least one interposed IC is powered by the third power supply voltage, and the at least one DRAM IC carries out refresh operations to preserve data stored within the plurality of memory cells while the memory device is placed in a lower power state in which the at least one interposed IC is deprived of power as a result of the third power supply voltage being removed by the power control circuit.

26. A method comprising:
signaling a memory device to enter into a lower power state, wherein the memory device is comprised of a plurality of memory cells organized into at least one two-dimensional array of rows and columns, a first logic to at least transmit signals to the memory cells and second logic to provide an external interface, wherein the memory cells and the first logic are powered by the first power supply voltage, and wherein the second logic is powered by the second power supply voltage;

depriving the second logic of power by removing the second power supply voltage;

carrying out at least one refresh operation wherein the first logic signals a row of the plurality of the memory cells through a word line to which the row of the plurality of memory cells and the first logic are coupled;

restoring the second power supply voltage to the second logic by providing the second power supply voltage; and signaling the memory device to exit the lower power state.

27. The method of claim 26, further comprising:

depriving an interposed IC of power by removing the second power supply voltage at substantially the same time that power is removed from the second logic, wherein the interposed IC is coupled to the external memory interface of the memory device and is powered by the second power supply voltage; and restoring power to the interposed IC by providing the second power supply voltage.

28. A machine-accessible medium comprising code that when executed by a processor within an electronic device, causes the electronic device to:

signal a memory device to enter into a lower power state, wherein the memory device is comprised of a plurality of memory cells organized into at least one two-dimensional array of rows and columns, a first logic to at least transmit signals to the memory cells and second logic to provide an external interface, wherein the memory cells and the first logic are powered by the first power supply voltage, and wherein the second logic is powered by the second power supply voltage;

deprive the second logic of power by removing the second power supply voltage;

signal the first logic to carry out at least one refresh operation wherein the first logic signals a row of the plurality of the memory cells through a word line to which the row of the plurality of memory cells and the first logic are coupled;

restore the second power supply voltage to the second logic by providing the second power supply voltage; and signaling the memory device to exit the lower power state.

29. The machine-accessible medium of claim 28, further causing the processor to:

deprive an interposed IC of power by removing the second power supply voltage at substantially the same time that power is removed from the second logic, wherein the interposed IC is coupled to the external memory interface of the memory device and is powered by the second power supply voltage; and restore power to the interposed IC by providing the second power supply voltage.

* * * * *